United States Patent
Jito et al.

(10) Patent No.: US 7,105,253 B2
(45) Date of Patent: *Sep. 12, 2006

(54) METHOD OF AND APPARATUS FOR MANUFACTURING LITHIUM SECONDARY CELL

(75) Inventors: Daizo Jito, Kobe (JP); Hisaki Tarui, Kobe (JP)

(73) Assignee: Sanyo Electric Co., Ltd., Osaka (JP)

(*) Notice: Subject to any disclaimer, the term of this patent is extended or adjusted under 35 U.S.C. 154(b) by 376 days.

This patent is subject to a terminal disclaimer.

(21) Appl. No.: 10/177,215

(22) Filed: Jun. 24, 2002

(65) Prior Publication Data

US 2003/0005578 A1   Jan. 9, 2003

(30) Foreign Application Priority Data

Jun. 25, 2001   (JP)   ............................ 2001-190599

(51) Int. Cl.
  *H01M 6/00*   (2006.01)
  *H01M 10/14*  (2006.01)
  *H01M 4/58*   (2006.01)
  *H01M 2/16*   (2006.01)

(52) U.S. Cl. .................... 429/254; 429/231.95; 29/730; 29/623.1; 29/623.2; 29/623.3; 29/623.4; 29/623.5

(58) Field of Classification Search ................. 29/730, 29/623.1, 623.2, 623.3, 623.4, 623.5; 429/231.95
  See application file for complete search history.

(56) References Cited

U.S. PATENT DOCUMENTS

| | | | | |
|---|---|---|---|---|
| 5,445,906 A | * | 8/1995 | Hobson et al. | ............. 429/162 |
| 6,649,033 B1 | * | 11/2003 | Yagi et al. | ............. 204/192.23 |
| 6,713,216 B1 | * | 3/2004 | Kugai et al. | ............ 429/231.95 |
| 6,746,494 B1 | * | 6/2004 | Karasawa et al. | ......... 29/623.1 |
| 6,815,003 B1 | * | 11/2004 | Yagi et al. | .................. 427/115 |
| 6,887,511 B1 | * | 5/2005 | Shima et al. | ................. 427/58 |
| 2002/0037756 A1 | * | 3/2002 | Jacobs et al. | ............... 455/572 |

FOREIGN PATENT DOCUMENTS

| | | |
|---|---|---|
| JP | 7-302588 | 11/1995 |
| JP | 11-96996 | 4/1999 |
| JP | 11-135115 | 5/1999 |
| WO | WO 01/29912 | 4/2001 |
| WO | WO 01/29913 A1 * | 4/2001 |

OTHER PUBLICATIONS

"Litium alloy negative electrodes formed from convertible oxides", Robert A. Huggins, *Solid State Ionics*, 113-115 (1998), pp. 57-67.

* cited by examiner

*Primary Examiner*—Dah-Wei Yuan
*Assistant Examiner*—Helen Chu
(74) *Attorney, Agent, or Firm*—McDermott Will & Emery LLP

(57) ABSTRACT

A method of manufacturing a lithium secondary cell capable of preventing an active material layer from oxidation and moisture absorption is obtained. This method of manufacturing a lithium secondary cell comprises steps of forming an active material layer on a collector by a method supplying raw material through discharge into a vapor phase and holding the collector formed with the active material layer at least under an inert atmosphere or under a vacuum atmosphere up to preparation of the cell. Thus, the collector formed with the active material layer is prevented from exposure to the atmosphere, whereby the active material layer is prevented from oxidation and moisture absorption. Consequently, a lithium secondary cell having excellent characteristics can be prepared.

6 Claims, 4 Drawing Sheets

METHOD OF AND APPARATUS FOR MANUFACTURING LITHIUM SECONDARY CELL

BACKGROUND OF THE INVENTION

1. Field of the Invention

The present invention relates to a method of and an apparatus for manufacturing a lithium secondary cell, and more specifically, it relates to a method of and an apparatus for manufacturing a lithium secondary cell by forming an active material layer on a collector by a method supplying raw material through discharge into a vapor phase.

2. Description of the Background Art

As to a lithium secondary cell recently subjected to flourishing research and development, cell characteristics such as the charge and discharge voltages, the operating cycle life and the storage characteristics remarkably depend on the employed electrodes. Therefore, active materials employed for the electrodes are improved for improving and upgrading the cell characteristics.

It is known that a cell having high energy density per weight and per volume is obtained when employing lithium metal as a negative active material. In this case, lithium is deposited by charging and dissolved by discharging on a negative electrode. When the cell is repetitively charged and discharged, lithium is repetitively deposited and dissolved on the negative electrode. Thus, lithium is disadvantageously dendritically deposited on the negative electrode. Consequently, inner shorting is disadvantageously caused.

To this end, there has been proposed a lithium secondary cell suppressing the aforementioned dendritic deposition of lithium by employing aluminum, silicon or tin electrochemically alloyed with lithium in charging as a negative electrode active material, as reported in Solid State Ionics, 113–115, p. 57 (1998), for example. Among these materials, silicon having particularly large theoretical capacity is a prospective material as the active material for the negative electrode of a cell exhibiting high capacity.

The assignee of the present invention has proposed an electrode for a lithium secondary cell having a microcrystalline silicon layer or an amorphous silicon layer formed on a collector by a method supplying raw material through discharge into a vapor phase such as CVD or sputtering in International Laying-Open No. WO01/29912 as an electrode for a lithium secondary cell employing silicon as a negative electrode active material and exhibiting excellent operating cycle characteristics.

The active material layer is formed on the collector by the aforementioned method supplying raw material through discharge into a vapor phase generally under a vacuum.

In general, however, an electrode preparer for forming the active material layer on the collector and a cell preparation apparatus for finally preparing the cell with the collector (electrode) formed with the active material layer are set on different positions. After forming the active material layer on the collector, therefore, the collector (electrode) formed with the active material layer must be temporarily discharged from the electrode preparer into the atmosphere and thereafter moved to the cell preparation apparatus for preparing the cell. When exposed to the atmosphere when making transition from preparation of the electrode to preparation of the cell, the surface of the active material layer is disadvantageously oxidized and absorbs moisture.

Moisture absorbed by the active material layer of the nonaqueous lithium secondary cell reacts with $LiPF_6$ or the like employed as lithium salt for an electrolyte to form hydrofluoric acid in the electrolyte, disadvantageously resulting in reduction of cell characteristics. When the surface of a negative electrode active material is oxidized, lithium is irreversibly used for reducing the active material. Therefore, the capacity of a positive electrode is reduced to disadvantageously reduce the cell capacity.

SUMMARY OF THE INVENTION

An object of the present invention is to provide a method of manufacturing a lithium secondary cell capable of preventing an active material layer from oxidation and moisture absorption when making transition from electrode preparation to cell preparation.

Another object of the present invention is to prevent a collector formed with the active material layer from exposure to the atmosphere when making transition from electrode preparation to cell preparation in the aforementioned method of manufacturing a lithium secondary cell.

Still another object of the present invention is to provide an apparatus for manufacturing a lithium secondary cell capable of obtaining a lithium secondary cell having excellent characteristics by preventing an active material layer from oxidation and moisture absorption.

In order to attain the aforementioned objects, a method of manufacturing a lithium secondary cell according to a first aspect of the present invention comprises steps of forming an active material layer on a collector by a method supplying raw material through discharge into a vapor phase and holding the collector formed with the active material layer at least under an inert atmosphere or under a vacuum atmosphere up to preparation of the cell. According to the present invention, the "method supplying raw material through discharge into a vapor phase" is a wide concept including PVD (physical vapor deposition) such as sputtering or vapor deposition and CVD (chemical vapor deposition) such as plasma CVD.

In the method of manufacturing a lithium secondary cell according to the first aspect, the collector formed with the active material layer is held at least either under an inert atmosphere or under a vacuum atmosphere up to preparation of the cell so that the collector formed with the active material layer is not exposed to the atmosphere, whereby the active material layer can be prevented from oxidation and moisture absorption. Consequently, a lithium secondary cell having excellent characteristics can be prepared.

In the aforementioned method of manufacturing a lithium secondary cell according to the first aspect, the step of forming the active material layer preferably includes a step of forming the active material layer on the collector in a first apparatus having a first preliminary chamber by the method supplying raw material through discharge into a vapor phase, and the step of holding the collector at least under an inert atmosphere or under a vacuum atmosphere preferably includes steps of bringing the first preliminary chamber provided in the first apparatus and an outwardly dischargeable closed vessel arranged in the first preliminary chamber into an inert atmosphere, and moving the collector formed with the active material layer into the closed vessel in the first preliminary chamber. According to this structure, the collector formed with the active material layer is held in the closed vessel under the inert atmosphere. Also when the closed vessel containing the collector formed with the active material layer is discharged outward from the first preliminary chamber, therefore, the collector formed with the active material layer can be effectively prevented from exposure to the atmosphere. In this case, the method of manufacturing a lithium secondary cell may further comprise a step of discharging the closed vessel into the atmosphere after the step of moving the collector formed with the active material layer into the closed vessel and keeping the vessel in the atmosphere up to preparation of the cell.

In the aforementioned case, the method of manufacturing a lithium secondary cell preferably further comprises a step of subjecting the closed vessel to a vacuum after the step of moving the collector formed with the active material layer into the closed vessel. According to this structure, the closed vessel can be readily vacuumized also when gas for forming the active material layer remains in the first preliminary chamber. Thereby, when the closed vessel containing the collector formed with the active material layer is discharged outward from the first preliminary chamber, the collector formed with the active material layer can be effectively prevented from exposure to the atmosphere. In this case, the step of subjecting the closed vessel to a vacuum preferably includes a step of evacuating the closed vessel through a pump. According to this structure, the closed vessel can be readily evacuated.

In the aforementioned case, the method of manufacturing a lithium secondary cell may further comprise a step of immediately moving the collector formed with the active material layer into a second apparatus for preparing the cell after the step of moving the collector into the closed vessel without keeping the closed vessel in the atmosphere. According to this structure, the collector formed with the active material layer is moved from the first apparatus into the second apparatus without exposure to the atmosphere, whereby the active material layer can be prevented from oxidation and moisture absorption. Consequently, a lithium secondary cell having excellent characteristics can be prepared.

The aforementioned method of manufacturing a lithium secondary cell according to the first aspect preferably further comprises a step of employing an apparatus prepared by integrating a first apparatus for forming the active material layer on the collector by the method supplying raw material through discharge into a vapor phase and a second apparatus for preparing the cell with the collector formed with the active material layer with each other thereby moving the collector formed with the active material layer from the first apparatus into the second apparatus without exposure to the atmosphere. According to this structure, the collector formed with the active material layer can be effectively prevented from exposure to the atmosphere without providing a closed vessel or the like for discharging the same outward. Consequently, the active material layer can be prevented from oxidation and moisture absorption with a simple apparatus structure.

In the aforementioned case, the step of forming the active material layer preferably includes a step of forming the active material layer on the collector by the method supplying raw material through discharge into a vapor phase in the first apparatus thereby forming a rolled negative electrode, and the method preferably further comprises a step of preparing the cell in the second apparatus with the rolled negative electrode. According to this structure, the cell can be readily mass-produced.

An apparatus for manufacturing a lithium secondary cell according to a second aspect of the present invention comprises a first apparatus for forming an active material layer on a collector by a method supplying raw material through discharge into a vapor phase, a first preliminary chamber provided in the first apparatus, an outwardly dischargeable closed vessel arranged in the first preliminary chamber, a second apparatus for preparing the cell with the collector formed with the active material layer, and a second preliminary chamber provided in the second apparatus for allowing introduction of the closed vessel.

The apparatus for manufacturing a lithium secondary cell according to the second aspect is structured in the aforementioned manner so that the collector formed with the active material layer can be prevented from exposure to the atmosphere also when the closed vessel is discharged outward if the collector formed with the active material layer is arranged in the closed vessel, which in turn is set at least either under an inert atmosphere or under a vacuum atmosphere. Thus, the active material layer can be prevented from oxidation and moisture absorption. Consequently, a lithium secondary cell having excellent characteristics can be prepared.

In the aforementioned apparatus for manufacturing a lithium secondary cell according to the second aspect, the closed vessel preferably includes an evacuative vacuum vessel. According to this structure, the closed vessel can also be readily evacuated when gas for forming the active material layer remains in the first preliminary chamber. Also when the closed vessel containing the collector formed with the active material layer is discharged outward from the first preliminary chamber, the collector formed with the active material layer can be effectively prevented from exposure to the atmosphere. In this case, the first preliminary chamber preferably further comprises a pump connected to the vacuum vessel for evacuating the vacuum vessel. According to this structure, the vacuum vessel can be readily evacuated through the pump.

In the aforementioned apparatus for manufacturing a lithium secondary cell according to the second aspect, the first apparatus may include a sputtering apparatus.

In the aforementioned apparatus for manufacturing a lithium secondary cell according to the second aspect, at least either the first preliminary chamber or the second preliminary chamber is preferably provided with a glove capable of receiving an externally inserted hand. According to this structure, the collector formed with the active material layer can be readily moved from the first apparatus into the closed vessel of the first preliminary chamber while moving the collector formed with the active material layer from the closed vessel of the second preliminary chamber into the second apparatus with the glove.

In the aforementioned apparatus for manufacturing a lithium secondary cell according to the second aspect, the second apparatus preferably includes a dry box brought into an inert atmosphere and a take-up arranged in the dry box. According to this structure, the cell can be prepared in the inert atmosphere, whereby the active material layer can be prevented from oxidation and moisture absorption. Consequently, a lithium secondary cell having excellent characteristics can be prepared.

The aforementioned apparatus for manufacturing a lithium secondary cell according to the second aspect preferably further comprises an openable/closable first door provided between the first preliminary chamber and the first apparatus, an openable/closable second door provided between the second preliminary chamber and the second apparatus, an openable/closable third door provided on a side of the first preliminary chamber coming into contact with an external device, and an openable/closable fourth door provided on a side of the second preliminary chamber coming into contact with the external device. According to this structure, the collector formed with the active material layer can be readily moved from the first apparatus into the second apparatus through the first and second preliminary chambers by opening/closing the first to fourth doors.

An apparatus for manufacturing a lithium secondary cell according to a third aspect of the present invention comprises a first apparatus for forming an active material layer on a collector by a method supplying raw material through discharge into a vapor phase and a second apparatus for preparing the cell with the collector formed with the active material layer, and the first apparatus and the second apparatus are integrated with each other.

The apparatus for manufacturing a lithium secondary cell according to the third aspect is structured in the aforementioned manner so that the collector formed with the active material layer can be effectively prevented from exposure to the atmosphere without providing a closed vessel or the like for discharging the collector outward. Consequently, the active material layer can be prevented from oxidation and moisture absorption with a simple apparatus structure.

The apparatus for manufacturing a lithium secondary cell according to the third aspect preferably further comprises a preliminary chamber set between the first apparatus and the second apparatus. According to this structure, the collector can be temporarily preserved in the preliminary chamber after formed with the active material layer in the first apparatus. Thus, the apparatus is applicable also when steps of forming the active material layer on the collector and preparing the cell with the collector formed with the active material layer are not continuously carried out.

In the aforementioned apparatus for manufacturing a lithium secondary cell according to the third aspect, the first apparatus may include a sputtering apparatus.

In the aforementioned apparatus for manufacturing a lithium secondary cell according to the third aspect, the preliminary chamber is preferably provided with a glove capable of receiving an externally inserted hand. According to this structure, the collector formed with the active material layer can be readily moved from the first apparatus into the second apparatus through the preliminary chamber.

In the aforementioned apparatus for manufacturing a lithium secondary cell according to the third aspect, the second apparatus preferably includes a dry box brought into an inert atmosphere and a take-up arranged in the dry box. According to this structure, the cell can be prepared in the inert atmosphere, whereby the active material layer can be prevented from oxidation and moisture absorption. Consequently, a lithium secondary cell having excellent characteristics can be prepared.

The aforementioned apparatus for manufacturing a lithium secondary cell according to the third aspect preferably further comprises an openable/closable first door provided between the preliminary chamber and the first apparatus, and an openable/closable second door provided between the preliminary chamber and the second apparatus. According to this structure, the collector formed with the active material layer can be readily moved from the first apparatus into the second apparatus through the preliminary chamber by opening/closing the first and second doors.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Examples of the present invention are now specifically described.

Figure 1:
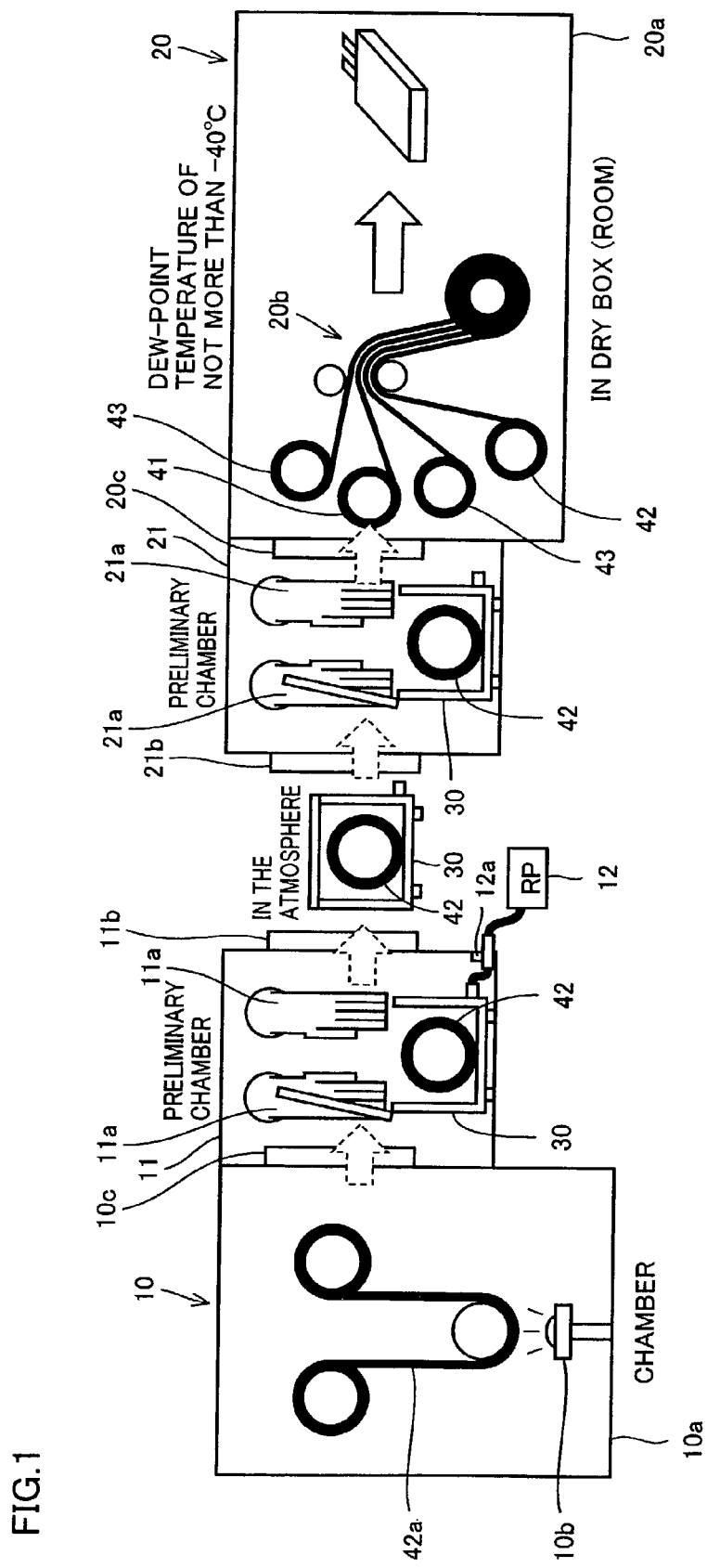
FIG. 1 schematically illustrates the overall structure of an apparatus for manufacturing a lithium secondary cell employed in Examples of the present invention.

Before describing Examples of the present invention, an apparatus for manufacturing a lithium secondary cell employed in Examples of the present invention is described. FIG. 1 is a schematic diagram showing the overall structure of the apparatus for manufacturing a lithium secondary cell employed in Examples of the present invention.

This apparatus for manufacturing a lithium secondary cell comprises a sputtering apparatus 10 for preparing an electrode (negative electrode) and a cell preparation apparatus 20 for finally preparing a cell with the electrode formed in the sputtering apparatus 10. The sputtering apparatus 10 is provided with a preliminary chamber 11, while the cell preparation apparatus 20 is provided with another preliminary chamber 21. An outwardly dischargeable desiccator 30 is arranged in the preliminary chamber 11. A rotary pump 12 is connected to the desiccator 30 arranged in the preliminary chamber 11 through a cock 12a.

The sputtering apparatus 10 is an example of the "first apparatus" according to the present invention, and the cell preparation apparatus 20 is an example of the "second apparatus" according to the present invention. The desiccator 30 is an example of the "closed vessel" and the "vacuum vessel" according to the present invention. The preliminary chamber 11 is an example of the "first preliminary chamber" according to the present invention, and the preliminary chamber 21 is an example of the "second preliminary chamber" according to the present invention.

The preliminary chamber 11 is provided with gloves 11a capable of receiving externally inserted hands, and the preliminary chamber 21 is also provided with similar gloves 21a. The sputtering apparatus 10 includes a vacuum chamber 10a and a sputtering source 10b arranged in the vacuum chamber 10a.

The cell preparation apparatus 20 includes a dry box 20a set to a dew-point temperature of not more than −40° C. and brought into an inert atmosphere such as an Ar atmosphere and a take-up 20b arranged in the dry box 20a.

An openable/closable door 10c is provided between the vacuum chamber 10a and the preliminary chamber 11, and another openable/closable door 11b is provided on a side of the preliminary chamber 11 coming into contact with an external device. Further, an openable/closable door 20c is provided between the preliminary chamber 21 and the cell preparation apparatus 20, and another openable/closable door 21b is provided on a side of the preliminary chamber 21 coming into contact with the external device.

The following Examples were carried out with the apparatus for manufacturing a lithium secondary cell having the aforementioned structure:

EXAMPLE 1

[Preparation of Negative Electrode]

Figure 2:
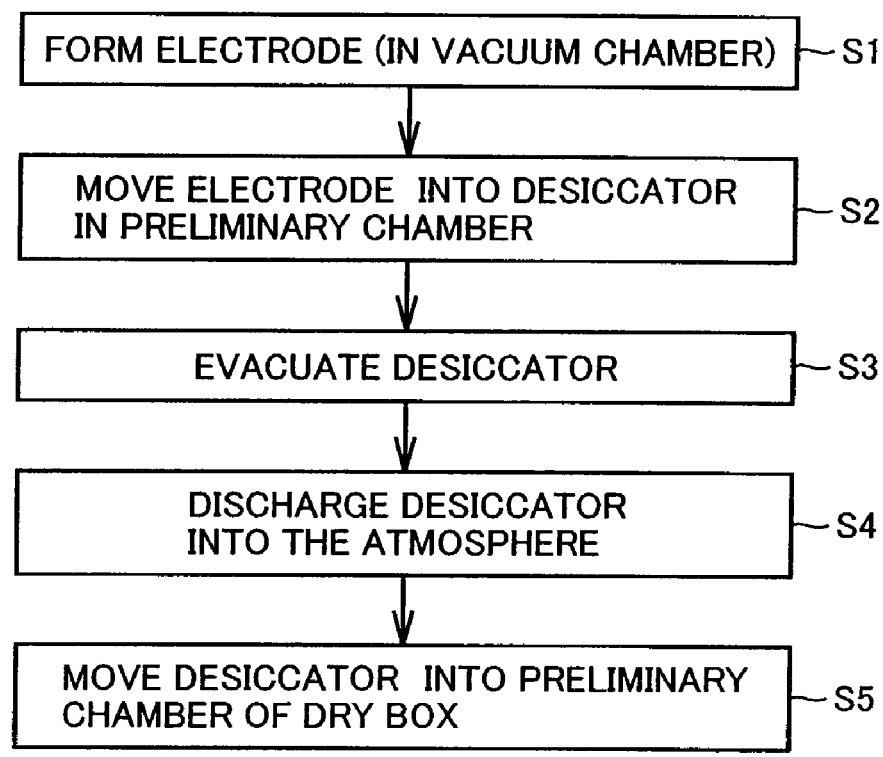
FIG. 2 is a flow chart for illustrating a procedure of preparing a lithium secondary cell according to Example 1 of the present invention.

FIG. 2 is a flow chart for schematically illustrating the procedure of preparing a negative electrode in Example 1. The method of preparing the electrode (negative electrode) according to Example 1 is now described with reference to the flow chart shown in FIG. 2. An electrode 42 is formed in the vacuum chamber 10a at a step S1, and thereafter moved into the desiccator 30 in the preliminary chamber 11 at a step S2. The desiccator 30 is evacuated through the rotary pump 12, to be decompressed to 10 Pa. Thereafter the desiccator 30 is discharged into the atmosphere at a step S4. The desiccator 30 is moved into the preliminary chamber 21 of the dry box 20a at a step S5. Thereafter the cell is prepared with the electrode (negative electrode) 42 in the dry boxy 20a.

The method of preparing the negative electrode 42 according to Example 1 is now described in detail. First, the sputtering apparatus 10 was employed for depositing an amorphous silicon layer on a collector 42a consisting of electrolytic copper plate having a thickness of 20 μm from the sputtering source 10b under conditions shown in Table 1, thereby preparing a rolled electrode (negative electrode) 42.

TABLE 1

| | |
|---|---|
| RF Power (Power Density) | 350 W (4.32 W/cm$^2$) |
| Gas Flow Rate | Ar 100 sccm |
| Sputtering Atmosphere | 0.10 Pa |
| Thickness of Si Thin Film | about 6 μm |
| Substrate Temperature | Room Temperature (not heated) |

After the temperature of the rolled electrode (negative electrode) 42 was sufficiently reduced, the internal pressure of the vacuum chamber 10a was returned to the atmospheric pressure under an Ar atmosphere. After the preliminary chamber 11 was set to the Ar atmosphere, the prepared electrode 42 was moved from the vacuum chamber 10a into the desiccator 30 provided in the preliminary chamber 11 with the gloves 11a.

A lid of the desiccator 30 was closed and the cock 12a was opened thereby decompressing the desiccator 30 to 10 Pa through the rotary pump 12, thereby setting the desiccator 30 to a vacuum atmosphere. The desiccator 30 decompressed in the aforementioned manner was discharged outward from the preliminary chamber 11 through the door 11b. Then, the desiccator 30 was introduced into the—preliminary chamber 21 through the door 21b thereof. In this embodiment, the collector formed with the active material layer is immediately moved into the second apparatus for preparing the cell (the preliminary chamber 21 of the cell preparation apparatus 20) after moving the collector into the closed vessel without keeping the closed vessel in the atmosphere. Further, the electrode (negative electrode) 42 was taken out from the desiccator 30 in the preliminary chamber 21 and moved into the dry box 20a through the door 20c with the gloves 21a. The electrode (negative electrode) 42 as well as a positive electrode 41 and separators 43 formed in other steps were wound on the take-up 20b, thereby preparing the cell.

The dry box 20a was set to the dew-point temperature of not more than −40° C. and under the inert atmosphere such as the Ar atmosphere, for preventing the electrode (negative electrode) 42 from oxidation or moisture absorption in the dry boxy 20a.

EXAMPLE 2

According to Example 2, an electrode (negative electrode) 42 was prepared under conditions similar to those in Example 1 and moved into the desiccator 30, which in turn was discharged outward. From this state, the desiccator 30 was kept in the atmosphere for one week, and thereafter introduced into the preliminary chamber 21 through the door 21b according to Example 2. The lid of the desiccator 30 was opened in the preliminary chamber 21 to take out the electrode 42, which in turn was moved into the dry box 20a. The electrode (negative electrode) 42 as well as a positive electrode 41 and separators 43 formed in other steps were wound on the take-up 20b, thereby preparing a cell.

COMPARATIVE EXAMPLE 1

According to comparative example 1, an electrode (negative electrode) 42 was prepared under conditions similar to those in Example 1, and thereafter temporarily discharged into the atmosphere. Then, the electrode 42 was moved into the desiccator 30, which in turn was decompressed to not more than 10 Pa and kept in the atmosphere for one week. Thereafter the desiccator 30 was introduced into the preliminary chamber 21, and the electrode 42 was taken out from the desiccator 30 and moved into the dry box 20a. Then, a cell was prepared.

COMPARATIVE EXAMPLE 2

According to comparative example 2, an electrode 42 was prepared under the same conditions as those in Example 1, thereafter kept in a state exposed to the atmosphere for one week, and moved into the dry boxy 20a for preparing a cell.

Each cell was prepared in the following procedure:

[Preparation of Positive Electrode]

As starting materials, $Li_2CO_3$ and $CoCO_3$ were weighed so that the atomic ratio Li:Co was 1:1, and mixed with each other in a mortar. This mixture was pressure-molded through a mold press of 17 mm in diameter and calcined in the air at 800° C. for 24 hours, thereby obtaining a burned product of $LiCoO_2$. This burned product was pulverized in a mortar to an average particle diameter of 20 μm. 90 parts by weight of the obtained $LiCoO_2$ powder and 5 parts by weight of artificial graphite powder for serving as a conductive agent were mixed into 5 percent by weight of N-methylpyrrolidone solution containing 5 parts by weight of polytetrafluoroethylene for serving as a binder, thereby preparing a positive electrode mixture slurry. This slurry was applied onto aluminum foil of 20 μm in thickness forming a positive electrode collector with a doctor blade and thereafter dried for forming a positive electrode.

[Preparation of Electrolyte]

1 mol/l of $LiPF_6$ was dissolved in a mixed solvent containing ethylene carbonate and diethyl carbonate in the same volumes for preparing an electrolyte.

[Preparation of Cell]

Figure 3:
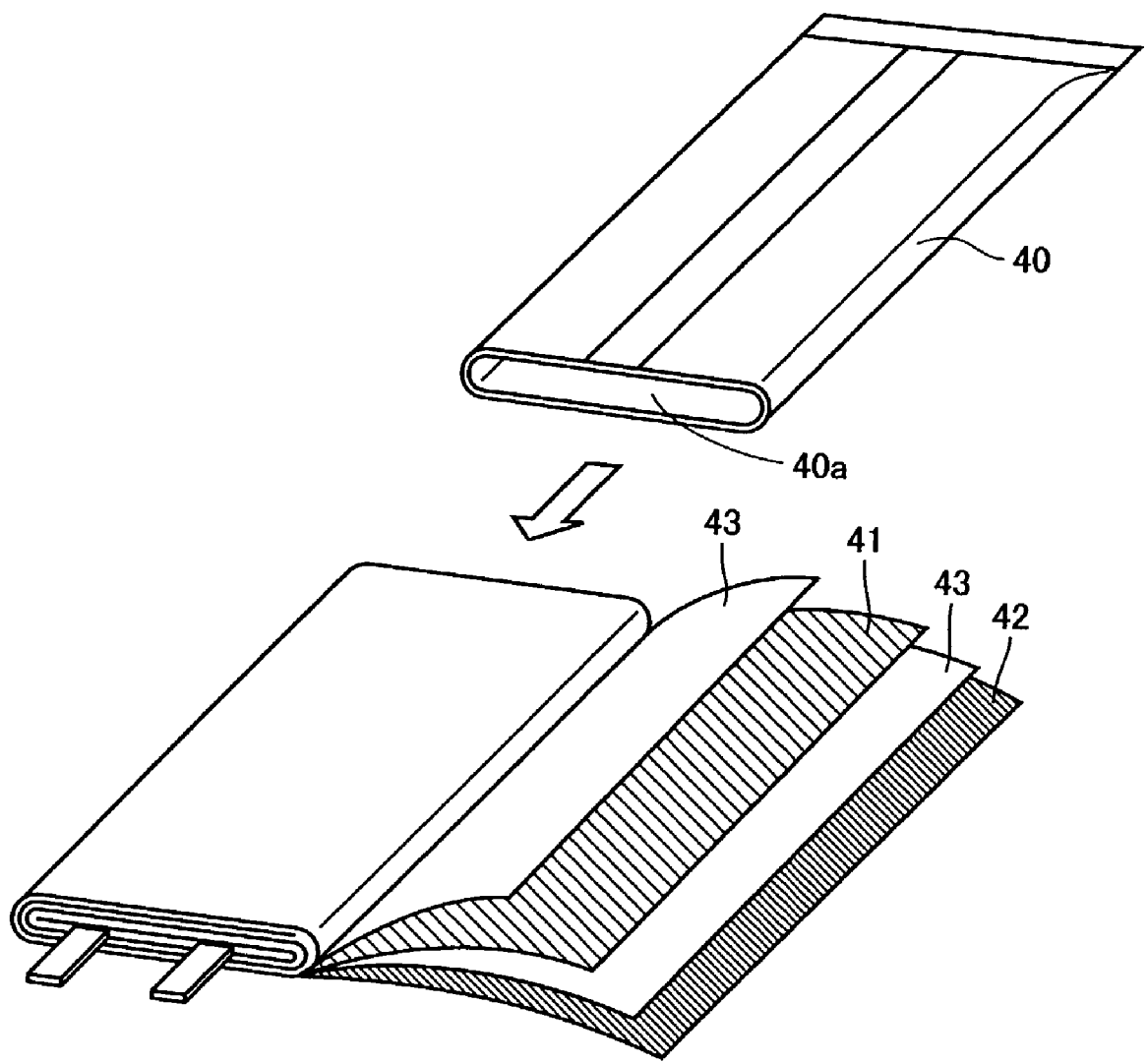
FIG. 3 is a perspective view for illustrating a method of preparing a lithium secondary cell according to the present invention.

As shown in FIGS. 1 and 3, a separator 43 was arranged between the positive electrode 41 and the negative electrode 42 while arranging another separator 43 on the positive electrode 41, so that the positive and negative electrodes 41 and 42 and the separators 43 were flatly wound and inserted into a sheath 40. Then, the electrolyte was injected into the sheath 40 and an opening 40*a* of the sheath 40 was sealed thereby completing the lithium secondary cell.

[Evaluation of Operating Cycle Characteristics]

An operating cycle test was performed on each lithium secondary cell prepared in the aforementioned manner. The lithium secondary cell was charged up to 4.2 V and discharged up to 2.75 V with a constant current of 100 mA. Table 2 shows the results.

TABLE 2

| | Discharge Capacity at the 1st Cycle (mAh) | Charge/Discharge Efficiency at the 1st Cycle (%) | Capacity Retention Ratio at the 10th Cycle (%) |
|---|---|---|---|
| Example 1 | 698 | 92.1 | 98.9 |
| Example 2 | 693 | 92.0 | 98.5 |
| Comparative Example 1 | 671 | 89.1 | 92.7 |
| Comparative Example 2 | 586 | 60.3 | 81.2 |

The charge/discharge efficiency at the first cycle and the capacity retention ratio at the tenth cycle in Table 2 are defined as follows respectively:

Charge/discharge efficiency (%) at first cycle=(discharge capacity at first cycle)/(charge capacity at first cycle)×100

Capacity retention ratio (%) at tenth cycle=(discharge capacity at tenth cycle)/(discharge capacity at first cycle)×100

It is clearly understood from Table 2 that the cells according to Examples 1 and 2 prepared while preventing the electrodes from exposure to the atmosphere with the desiccator are superior to those according to comparative examples 1 and 2 in all of the discharge capacity at the first cycle, the charge/discharge efficiency at the first cycle and the capacity retention ratio at the tenth cycle. It is also understood that the cell according to comparative example 2 exposed to the atmosphere for a long period is lower in discharge capacity, charge/discharge efficiency and capacity retention ratio as compared with the cell according to comparative example 1 exposed to the atmosphere for a shorter period.

As hereinabove described, the collector (the electrode 42) formed with an active material layer is held under a vacuum atmosphere in the desiccator 30 up to preparation of the cell to be prevented from exposure to the atmosphere in each of Examples 1 and 2, whereby the active material layer can be prevented from oxidation and moisture absorption. Consequently, a lithium secondary cell having excellent characteristics can be prepared.

Although the present invention has been described and illustrated in detail, it is clearly understood that the same is by way of illustration and example only and is not to be taken by way of limitation, the spirit and scope of the present invention being limited only by the terms of the appended claims.

Figure 4:
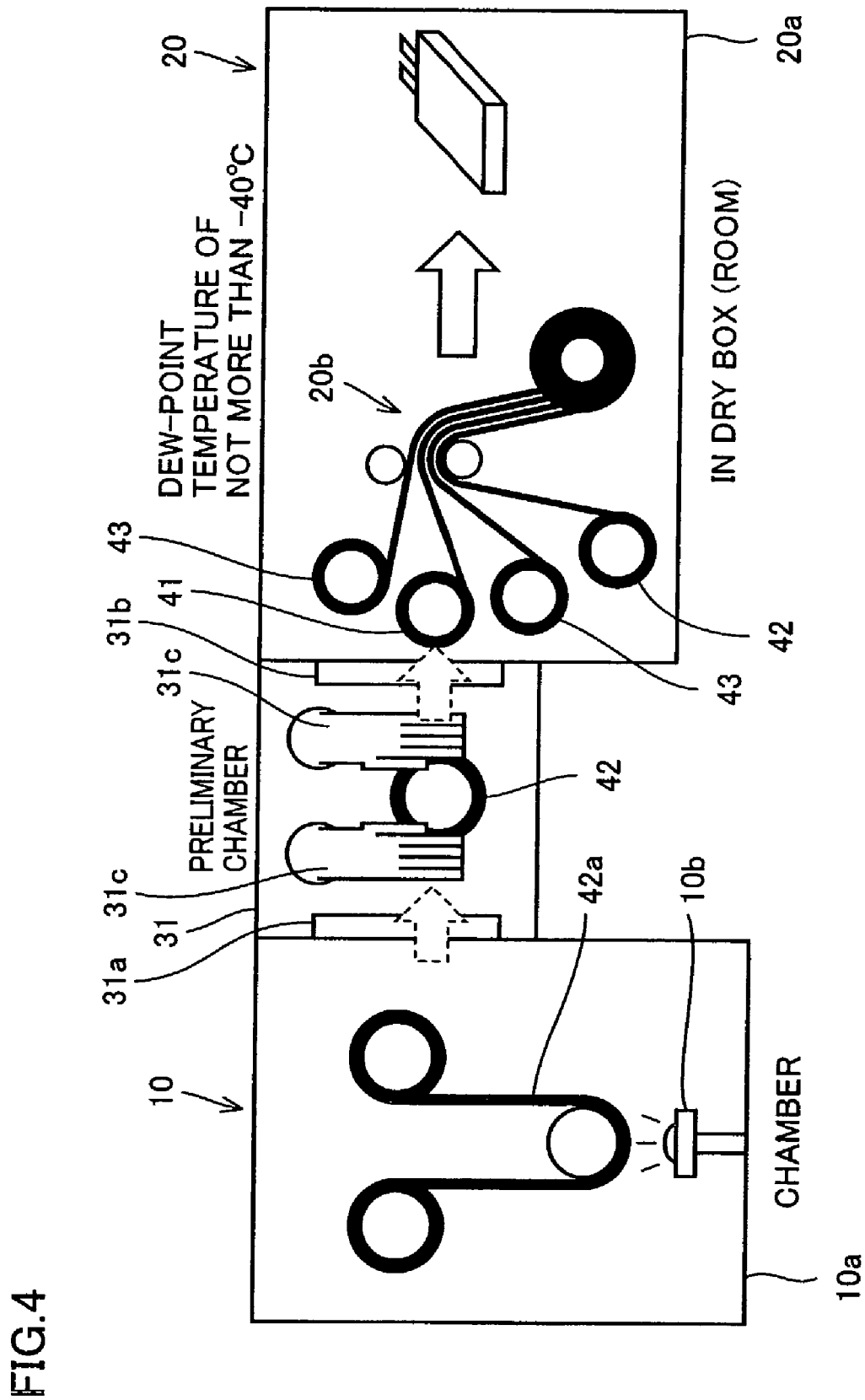
FIG. 4 schematically illustrates a modification of the apparatus for manufacturing a lithium secondary cell shown in FIG. 1.

For example, while the electrode preparation part (the sputtering apparatus 10) and the cell preparation part (the cell preparation apparatus 20) are separately set in the apparatus for manufacturing a lithium secondary cell shown in FIG. 1 employed in the aforementioned Examples 1 and 2, the present invention is not restricted to this but another apparatus for manufacturing a lithium secondary cell having an electrode preparation part (a sputtering apparatus 10) and a cell preparation part (a cell preparation apparatus 20) integrated with each other through a preliminary chamber 31 may alternatively be employed as shown in FIG. 4, for example.

In the apparatus for manufacturing a lithium secondary cell shown in FIG. 4, the sputtering apparatus 10 and the cell preparation apparatus 20 are connected with each other through the preliminary chamber 31. An electrode (negative electrode) 42 prepared in the sputtering apparatus 10 is moved into the cell preparation apparatus 20 with gloves 31*c* through doors 31*a* and 31*b* provided on the preliminary chamber 31. According to this apparatus, the electrode 42 prepared in the sputtering apparatus 10 may not be discharged outward and hence the desiccator 30 shown in FIG. 1 is unnecessary. Therefore, an active material layer can be prevented from oxidation and moisture absorption with a simple apparatus structure. When steps of preparing the electrode 42 and preparing a cell with the electrode 42 are not continuously carried out, the electrode 42 can be temporarily held in the preliminary chamber 31.

In the apparatus shown in FIG. 4, the sputtering apparatus 10 and the cell preparation apparatus 20 may alternatively be directly integrated with each other without providing the preliminary chamber 31.

While the desiccator 30 is decompressed and set to a vacuum atmosphere for preserving the electrode 42 in the desiccator 30 in Example 2, the present invention is not restricted to this but the desiccator 30 may alternatively be charged with inert gas in an unevacuated state for preserving the electrode 42 therein.

While the active material layer is formed on the collector by sputtering in each of Examples 1 and 2, the present invention is not restricted to this but another method supplying raw material through discharge into a vapor phase may alternatively be employed. For example, the present invention is also applicable to a case of forming an active material layer on a collector by vacuum deposition or plasma CVD.

While the desiccator 30 is employed for preserving the electrode 42 in each of Examples 1 and 2, the present invention is not restricted to this but another closed vessel may alternatively be employed so far as the same can preserve the electrode 42 at least under either an inert atmosphere or a vacuum atmosphere.

What is claimed is:

1. A method of manufacturing a lithium secondary cell comprising steps of:

forming an active material layer of amorphous silicon on a collector by a method supplying raw material through discharge into a vapor phase; and holding said collector formed with said active material layer at least under an inert atmosphere or under a vacuum atmosphere up to preparation of said cell, wherein said step of forming said active material layer includes a step of forming said active material layer on said collector in a first apparatus having a first preliminary chamber by said method supplying raw material through discharge into a vapor phase, and said step of holding said collector at least under an inert atmosphere or under a vacuum atmosphere includes steps of:

bringing said first preliminary chamber provided in said first apparatus and an outwardly dischargeable closed vessel arranged in said first preliminary chamber into an inert atmosphere, moving said collector formed with said active material layer into said closed vessel in said first preliminary chamber; and subjecting said closed vessel to a vacuum after said step of moving said collector formed with said active material layer into said closed vessel.

2. The method of manufacturing a lithium secondary cell according to claim 1, further comprising a step of discharging said closed vessel into the atmosphere after said step of moving said collector formed with said active material layer into said closed vessel and keeping said closed vessel in said atmosphere up to preparation of said cell.

3. The method of manufacturing a lithium secondary cell according to claim 1, wherein said step of subjecting said closed vessel to a vacuum includes a step of evacuating said closed vessel through a pump.

4. The method of manufacturing a lithium secondary cell according to claim 1, further comprising a step of immediately moving said collector formed with said active material layer into a second apparatus for preparing said cell after said step of moving said collector into said closed vessel without keeping said closed vessel in the atmosphere.

5. The method of manufacturing a lithium secondary cell according to claim 1, further comprising a step of preparing said cell with said collector formed with said active material layer with each other in a second apparatus, the method comprising moving said collector formed with said active material layer from said first apparatus into said second apparatus without exposure to the atmosphere.

6. The method of manufacturing a lithium secondary cell according to claim 1, wherein said step of forming said active material layer includes a step of forming said active material layer on said collector by said method supplying raw material through discharge into a vapor phase in said first apparatus thereby forming a rolled negative electrode, said method further comprising a step of preparing said cell in a second apparatus with said rolled negative electrode.

\* \* \* \* \*